United States Patent [19]
Kato et al.

[11] Patent Number: 5,445,484
[45] Date of Patent: Aug. 29, 1995

[54] VACUUM PROCESSING SYSTEM

[75] Inventors: Shigekazu Kato; Naoyuki Tamura, both of Kudamatsu; Kouji Nishihata, Tokuyama; Tsunehiko Tsubone, Hikari; Atsushi Itou, Kudamatsu, all of Japan

[73] Assignee: Hitachi, Ltd., Tokyo, Japan

[21] Appl. No.: 131,911

[22] Filed: Oct. 4, 1993

Related U.S. Application Data

[63] Continuation of Ser. No. 796,672, Nov. 25, 1991, abandoned.

[30] Foreign Application Priority Data

Nov. 26, 1990 [JP] Japan .................. 2-317810

[51] Int. Cl.$^6$ ............................. B65G 49/05
[52] U.S. Cl. .......................... 414/217; 414/416; 414/939; 414/940; 414/937; 118/719
[58] Field of Search ............... 414/331, 222, 416, 417, 414/935, 937, 939, 940, 941, 217; 118/719; 204/298.25

[56] References Cited

U.S. PATENT DOCUMENTS

| | | | |
|---|---|---|---|
| 4,405,435 | 9/1983 | Tateishi et al. | 414/217 X |
| 4,584,045 | 4/1986 | Richards | 414/217 X |
| 4,705,951 | 11/1987 | Layman et al. | 414/217 X |
| 4,746,256 | 5/1988 | Boyle et al. | 414/DIG. 3 X |
| 4,759,681 | 7/1988 | Nogami | 414/DIG. 3 X |
| 4,808,059 | 2/1989 | Eddy | 414/DIG. 3 |
| 4,824,309 | 4/1989 | Kakehi et al. | 414/217 |
| 4,867,629 | 9/1989 | Iwasawa et al. | 414/DIG. 6 X |
| 4,907,931 | 3/1990 | Mallory et al. | 414/DIG. 3 X |
| 4,923,584 | 5/1990 | Bramhall, Jr. et al. | 414/DIG. 3 X |
| 4,932,828 | 6/1990 | Katae et al. | 414/331 X |
| 4,936,734 | 6/1990 | Osada | 414/DIG. 6 X |
| 4,951,601 | 8/1990 | Maydan et al. | 414/217 X |
| 5,044,871 | 9/1991 | Davis et al. | 414/DIG. 3 X |
| 5,048,164 | 9/1991 | Harima | 414/DIG. 6 X |

FOREIGN PATENT DOCUMENTS

| | | | |
|---|---|---|---|
| 0398365 | 5/1990 | European Pat. Off. | |
| 18032 | 1/1987 | Japan | 414/331 |
| 140523 | 6/1988 | Japan | 414/DIG. 6 |

OTHER PUBLICATIONS

400 Solid State Technology 31 (1988) May, No. 5, Port Washington, N.Y., USA "Dual Chamber Dry Etch System".
Partial European Search Report EP 91 31 0822.

*Primary Examiner*—Frank E. Werner
*Attorney, Agent, or Firm*—Antonelli, Terry, Stout & Kraus

[57] ABSTRACT

A vacuum processing system of a type in which wafer cassettes each accommodating a plurality of wafers to be treated are supplied to deliver the wafers and wafer cassettes collecting the treated wafers are taken out. To enable the vacuum treatment, the vacuum processing system has a structure comprising:

a plurality of wafer cassettes each being set in the atmospheric air and holding a plurality of wafers to be treated; at least one vacuum processing chamber for effecting vacuum treatment on the wafers; at least one load-lock chamber disposed between the cassettes and the vacuum processing chamber, the wafers being transferred into and out of vacuum atmosphere in the vacuum processing chamber through the load-lock chamber; and a wafer transfer device for transferring the wafers from each of the cassettes to the load-lock chamber and vice versa. The wafer cassettes are arranged on a substantially horizontal flat surface with respect to each other and each of the cassettes has two upper and lower stationary positions, and the transference of the wafers from and into each of the cassettes is conducted at one of the upper and lower stationary positions.

5 Claims, 1 Drawing Sheet

VACUUM PROCESSING SYSTEM

This application is a Continuation of application Ser. No. 07/796,672, filed Nov. 25, 1991, now abandoned.

BACKGROUND OF THE INVENTION

1. Field of the Invention

The present invention relates to a vacuum processing system into which a wafer cassette, which holds a plurality of wafers to be treated, is fed and another wafer cassette into which treated wafers are put is taken out.

2. Description of the Related Art

In a vacuum processing system, such as dry etching system, CVD system, sputtering system and the like, in general, the operation is as follows: A predetermined number of wafers to be treated are held in a wafer cassette as a single unit (generally called a lot), the wafer cassette which holds the wafers is introduced into the system, and another wafer cassette into which the predetermined number of treated wafers are put is taken out, thus attaining high production efficiency.

One example of the conventional vacuum processing systems is shown in Japanese Patent Unexamined Publication No. 60-74531. In this system, the wafer cassette is placed on the table in the atmosphere, and the loading chamber is brought to atmospheric pressure. A first isolating valve between the loading chamber and the table is opened and a cassette drive unit and a wafer carrier cooperate with each other so that the first wafer to be treated, which is held in the lowest stage of the wafer loading cassette, is fed into the loading chamber. After the first isolating valve is closed and the loading chamber is evacuated, the second isolating valve provided between the loading chamber and a wafer processing chamber is opened, and thus the loading chamber is communicated with the wafer processing chamber. The wafer is moved into the wafer processing chamber, and the second isolating valve is closed so that the desired treatment is performed on the wafer. During this treatment, the loading chamber is returned to atmospheric pressure again and the second wafer to be treated, which is held in the second stage from the bottom of the wafer loading cassette, is fed into the loading chamber. When the treatment of the first wafer is completed, the first wafer is fed into an unloading chamber and the second wafer is fed into the wafer processing chamber. While the second wafer is being treated, the first wafer is put into the uppermost stage of the wafer unloading cassette via the unloading chamber which has been returned to the atmospheric pressure. Other wafers are also treated one by one in the same manner. After the last wafer has been put into the wafer unloading cassette, the wafer unloading cassette is taken out.

The arrangement, however, may be modified when occasion demands such that the wafer is directly fed into the vacuum processing chamber without being passed through the loading chamber. An example of such a modified vacuum processing system is shown in Japanese Patent Unexamined Publication No. 55-162231.

A carrying unit shown, for example, in Japanese Patent Unexamined Publication No. 63-273331 is proposed in that it is designed to prevent contamination from generating due to dust, etc. which is stuck to wafers and a wafer cassette at the time that the wafers are carried into a semiconductor production process. In a wafer treatment of this example, when the wafers are carried out from the cassette and are put into the cassette, the cassette stage, on which the cassette is set, is fixed, while a carrying arm is provided in such a manner that it can be moved upwardly, downwardly, rotationally, or straightforwardly. At the same time, the drive portion is held inside the cover to comply with the above-described demands.

Another example of the system of the related arts is shown in Japanese Patent Unexamined Publication No. 63-211645. In this example, the cassette is fixed and a mechanism, in which two carrying arms formed on the upper and lower stage are moved upwardly and downwardly, is employed so that the generation of contamination due to dust, etc. can be prevented. At the same time, the carrying arms can access the wafer in the cassette randomly and each of the treated wafers can be fed back to the original position where one of the wafers to be treated was held.

SUMMARY OF THE INVENTION

In recent years, high micronization, integration and density of electronic devices, including semiconductor elements, has become required more and more. There has been a strong tendency to keep a worker out of producing environment, because a man is the greatest factor of the particle-generation which prevents an increase in a yield. Conventionally, in such a production site, workers are engaged in working for transferring products between the systems and between the production lines, for introducing wafers to be treated into the system, and for taking the wafers out. Nowadays most of these works can be conducted by transfer robots. Therefore, the system, in which the transfer robot carries out such working, has been employed. The production system also is required to interface with the transfer robot.

With such automatization of the production line, a production control system is automatized. The system has been used in which production-control information is given to every product carried by the robot, treatment in each process is performed according to the given information, and the treatment records are stored. In the system, though one cassette of products is routinely carried by the robot as one product unit, two cassettes may be carried as one unit or a plurality of product units may be intermingled in one cassette. A production system, therefore, is required to flexibly adapt to user's needs.

The related arts described before will be discussed in the light of the above-described change of the environment. In the first example of the prior art, when a product unit consists of a plurality of cassettes, on both load-/unload sides there are required a plurality of cassette moving mechanisms corresponding to the constitution. Accordingly, problems that the construction is complicated and the cost is increased are brought up. All the wafers held in the cassette, whether they have been treated or not, are required to move whenever one wafer is taken in and out of the cassette. Therefore, problems that dust is generated and sticks to the wafer cannot be avoided.

In view of the above-described problems, the system shown in Japanese Patent Unexamined Publication No. 63-273331 is intended to simplify the system and solve the problem of dust-generation by fastening the cassette. However, even though this system is formed in combination with a system such as the first example of the prior arts, the following problems remain unsolved.

That is, in the above-described prior arts, the wafer loading cassette, which is set on the introducing side and holds the wafers to be treated, and the wafer unloading cassette, which is set on the taking-out side and is empty, are always required to be introduced and taken out in pairs. The treated wafers are held in the wafer unloading cassette in reverse order in which the wafers are held in the wafer loading cassette. Therefore, in order to adapt to an ordinary method in which production information is given to every cassette, the treated wafers are required to be transferred again from the wafer unloading cassette which once holds the treated wafers to the wafer loading cassette which has become empty. There have been problems in which not only the number of steps increases but also the yield deteriorates due to dust-generation. Viewed at operational efficiency of the system, there is caused inconvenience in which the new introduction of wafers must be waited, or the processing of the newly introduced wafers must be suspended until all the wafers which have been introduced from the wafer loading cassette are put into the wafer unloading cassette and the next empty cassette is set.

On the other hand, the system shown in Japanese Patent Unexamined Publication No. 63-211645 has achieved a solution to the above-described problems as follows. The system has a mechanism in which the cassette is fixed and two carrying arms positioned on the upper and lower stages operate upwardly and downwardly, so that the arms can randomly access the wafers in the cassette and the treated wafers can be transferred into the original position where the wafers were held before the treatment. However, there is no consideration for an interface between the transfer robot and the system/process according to the automatization of the production line.

In this conventional system, when a plurality of cassettes are introduced into the system, the cassettes are required to be set in the upper and lower two stages or more. Therefore, the system contains the following disadvantages. The transfer robot on the line needs a complicated operation. Further, it is impossible to take out the cassette which is set in the lower side unless the upper side cassette has been taken out. Even though a plurality of the cassettes are introduced, the system needs a long dead time (system-inoperative time for cassette replacement).

An object of the present invention is to provide a vacuum processing system which can be easily adapted to automatization of the production line and can decrease contamination of products due to dust-generation, etc., while realizing high production efficiency and a high product yield.

To achieve the above-described objects, the present invention provides a vacuum processing system which has a plurality of wafer cassettes, each holding a plurality of wafers to be treated on a substantially horizontal flat surface in the atmospheric pressure. Further, each of the wafer cassettes has upper and lower stationary positions and the wafers are taken in and out of the cassette which is set in either the upper or lower stationary position.

DETAILED DESCRIPTION OF THE PREFERRED EMBODIMENT

One embodiment of the present invention is described below with reference to FIGS. 1 and 2.

Figure 1:
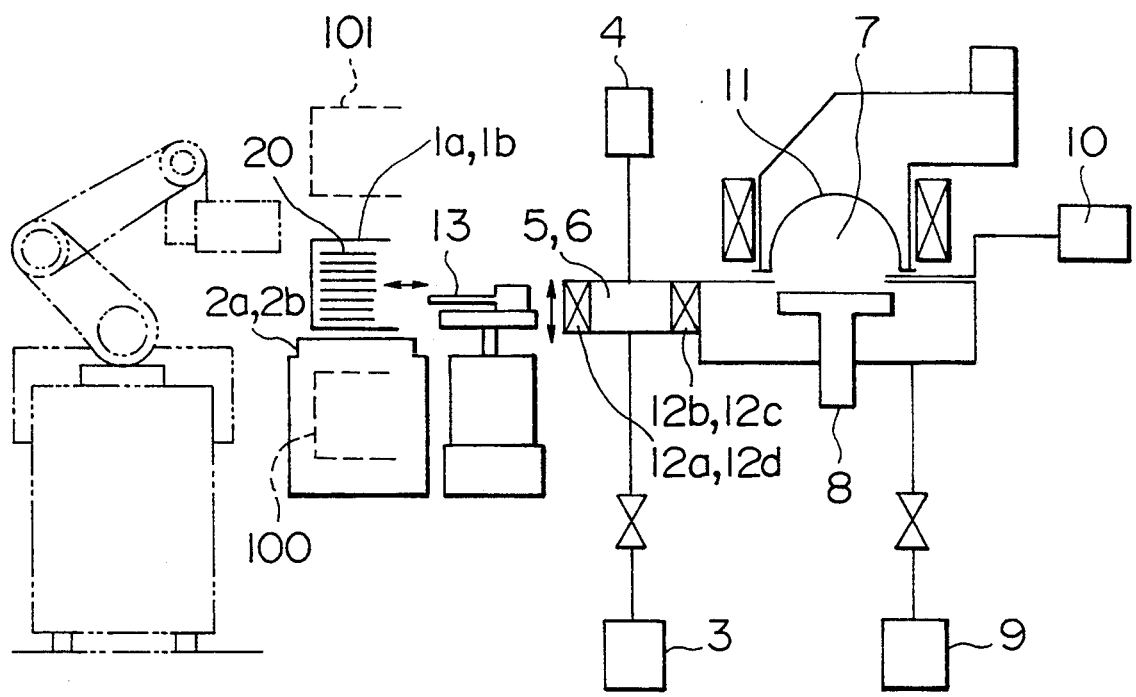
FIG. 1 is a front view of a dry etching system according to one embodiment of the present invention.
Figure 2:
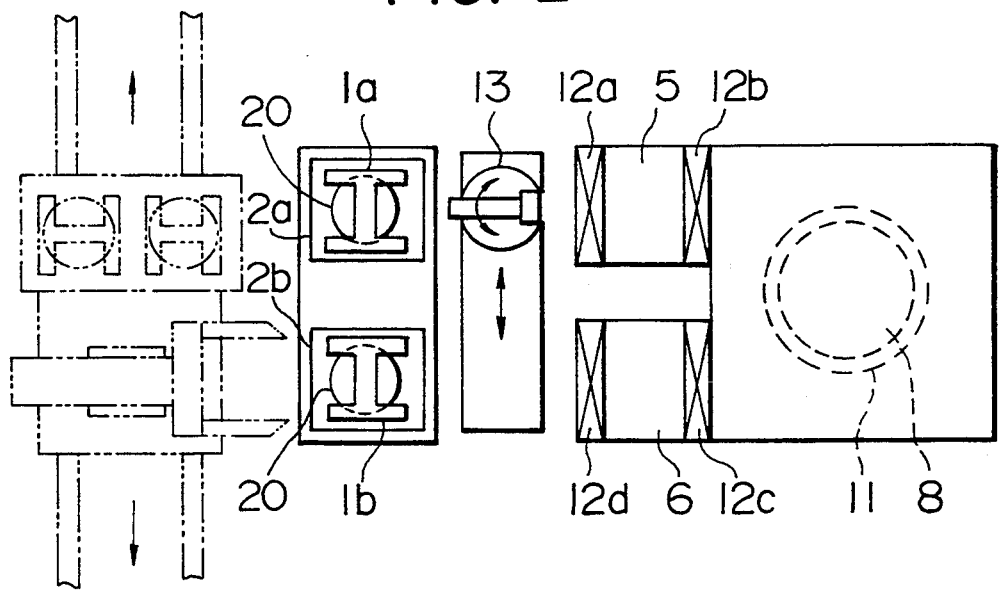
FIG. 2 is a plan view of the system shown in FIG. 1.

FIG. 1 shows an application of one example of a vacuum processing system according to the present invention which performs dry etching of a semiconductor wafer. FIG. 2 is a plan view of the system shown in FIG. 1.

The vacuum processing system comprises: a plurality of cassettes $1a$ and $1b$, each of which can hold a plurality of wafers (normally twenty-five wafers), for containing and putting processing objects (wafers to be treated) into the system and for containing again the treated wafers to the original position in the cassette where the wafers are held before treatment; and, cassette stands $2a$ and $2b$, on which the cassettes $1a$ and $1b$ are disposed, for determining positions in which the cassettes are taken into and out of the system. Further, the vacuum processing system comprises: a load-lock chamber 5 for introducing the wafer to be treated into a vacuum atmosphere provided with a vacuum evacuation unit 3 and a gas-feeding unit 4; an unload-lock chamber 6 for taking out the treated wafer into the atmosphere; an etching treatment chamber 11 including an electric discharging portion 7 for performing etching on the wafer, a wafer stage 8, a vacuum-evacuation system 9 and a gas-feeding unit 10; isolation valves 12 capable of hermetically separating each of the chambers; a transfer unit 13, provided with a robot having X, Y, Z, and $\theta$ axes and disposed between the load-lock chamber 5/unload-lock chamber 6 and the cassettes $1a/1b$, for transferring a wafer between the load-lock chamber 5/unload-lock chamber 6 and the cassettes $1a/1b$.

Operation of the vacuum processing system will now be described. Firstly, the cassettes $1a$ and $1b$ which hold wafers to be treated are supplied from a stocker to the system by a transfer robot or an operator and they are disposed on the cassette stands $2a$ and $2b$. At this time, since the cassette stands $2a$ and $2b$ are positioned on the same plane which is approximately level the operation for supplying the cassettes is simplified to make it easy to adapt this system to automatization of the production line. Alternatively, the system can treat the wafer due to realizing itself the production information given to the cassette, or depending on the information sent from a master controller or a command input by an operator.

At least one wafer 20 to be treated which is held in the cassette $1a$ is taken out by the transfer unit 13 and is supplied, through the isolation valve $12a$, into the load-lock chamber 5, which is disposed on an opposite side to the cassette $1a$ with respect to the transfer unit. The wafer 20 may be any one of the wafers held in the cassette $1a$. The wafer 20 is completely cut off from the atmosphere of the exterior of the system after the wafer 20 has been fed into the load-lock chamber 5 through the isolation valve $12a$ until the same is put out through the unload-lock chamber 6 through the isolation valve $12d$. Therefore, partitions are provided on the position of the isolation valves $12a$ and $12d$ as a boundary line so that the cassette stands $2a$ and $2b$, the cassettes $1a$ and $1b$ positioned on the cassettes stands, and the transfer unit 13 can be disposed in the clean-room having high purity of air. While other portions of the system are disposed in the maintenance room having comparatively low purity of air. After the isolation valve $12a$ is closed, the load-lock chamber 5 is evacuated to a predetermined pressure by the vacuum evacuation unit 3. Then, the isolation valve 12b is opened and the wafer 20 is fed into the etching chamber 11, and is placed on the wafer stage 8.

The wafer 20, which has been fed into the etching chamber 11, is etched under predetermined conditions. Meanwhile, the pressure in the load-lock chamber 5 is reset to atmospheric pressure by the gas-feeding unit 4, with the isolation valves 12a and 12b being closed. Then, a second wafer is fed by the transfer device 13 into the load-lock chamber 5 through the isolation valve 12a which is now opened, as is the case of the first wafer. The load-lock chamber 5 is evacuated to a predetermined pressure by the vacuum evacuation unit 3. When etching of the first wafer 20 is completed, the isolation valve 12c is opened and the treated wafer 20 is transferred into the unload-lock chamber 6. Then, the isolation valve 12c is closed and the isolation valve 12b is opened so that the second wafer is fed into the etching chamber 11 from the load-lock chamber 5 and the etching treatment begins after the isolation valve 12b is closed.

After the pressure in the unload-lock chamber 6 is reset to the atmospheric pressure, the treated wafer 20, which has been transferred into the unload-lock chamber 6, is brought into the atmosphere by the transfer unit 13 through the isolation valve 12d so that the treated wafer 20 is returned to original position in the cassette 1a where the wafer 20 was held at first.

The described operation is repeated so that the vacuum treatment is completed on all the wafers which were held in the cassette 1a and the treated wafers are returned to the original positions, whereby the cassette 1a becomes ready to take out and is replaced with another cassette which holds untreated wafers. Meanwhile, the system continues to treat the untreated wafers in the cassette 1b. It will be seen that the system operates without stopping provided that a next, i.e., a third, cassette is fed before completion of treatment of all the wafers which were held in the cassette 1b.

In the event that the cassette 1b causes an impediment to the operation for taking out the cassette 1a, partly because of a restriction in the degree of freedom of movement of the cassette supply/take-out robot on the production line and partly because of the positioning of both cassettes 1a and 1b on the same horizontal flat planes, it is advisable to retract the cassette 1a to a retracted position 100 of a level below the level of the cassette 1b or a retracted position 101 of a level above the level of the cassette 1b. The transference of the cassette 1a to the retracted position does not require any pitch operation as required in an ordinary cassette elevator, so that resetting of the cassette from the retracted position to the original position can be conducted promptly, without substantially affecting the operation of the transfer device 13 making access to the cassette 1b.

As has been described, according to the present invention, it is possible to easily supply and take-out the substrate cassette by a transfer robot and to continuously treat wafers. The vacuum processing system of the present invention, therefore, can easily be adapted to automatization of production line. In addition, the distance to be traveled by each wafer is minimized so that generation of dust also is minimized, thus ensuring a higher yield of the products.

What is claimed is:

1. A wafer processing system comprising:
    two cassettes each having a plurality of wafers stored at respective locations therein;
    first and second cassette stands for supporting respective ones of said two cassettes in horizontally spaced relation without a separator at a boundary therebetween;
    means for moving respective ones of each of said first and second cassette stands between first and second vertically spaced positions;
    a vacuum processing chamber for processing said wafers in a vacuum condition therein;
    wafer transfer means located between said cassette stands and said vacuum processing chamber for transferring said wafers between each cassette, when its associated cassette stand is held in its first position, and said vacuum processing chamber; and
    cassette supply and take-out means for supplying and taking out a cassette to and from one of said first and second cassette stands in its first position when the other of said first and second cassette stands is in its second position.

2. A wafer processing system according to claim 1, wherein said wafer transfer means transfers the wafers in each cassette without requiring that said cassette be moved from its first position.

3. A wafer processing system with an accommodation for a plurality of cassettes each having a plurality of locations at which respective wafers are stored comprising:
    a plurality of cassette stands for installing respective cassettes in horizontally spaced relation in an atmospheric air, each of said cassette stands having a stationary position when said wafers are accessed and having means for moving respective ones of each of said plurality of cassette stands between first and second vertically spaced positions, for exchanging a cassette on one of said cassette stands with a new cassette when said one cassette stand is in its first position and another of said cassette stands is in its second position;
    a vacuum processing chamber for processing said wafers in a vacuum condition therein;
    a wafer transfer unit including a wafer transfer robot for transferring wafers, said wafer transfer robot being movable across wafer transfer paths between said plurality of cassette stands and said vacuum processing chamber, and in a height direction for accessing said locations in said cassettes installed on said cassette stands to take in/out said wafers;
    a load-lock chamber disposed along said wafer transfer paths between said transfer robot and said vacuum processing chamber for transferring said wafers therethrough in said atmospheric air when said wafers are received from a cassette and in said vacuum condition when said wafers are supplied to said processing chamber; and
    an unload-lock chamber disposed along said wafer transfer paths between said transfer robot and said vacuum processing chamber for transferring said wafers therethrough in said atmospheric air when said wafers are supplied to a cassette and in said vacuum condition when said wafers are received from said processing chamber.

4. A wafer processing system according to claim 3, wherein said wafer transfer robot is movable to all locations in each of said cassettes held in said cassette stands for accessing all locations in said cassettes while the positions of said cassettes is unchanged.

5. A wafer processing system with an accommodation for two cassettes each having a plurality of locations at which respective wafers are stored comprising:
two cassette stands for installing respective cassettes in horizontally spaced relation without a separator at a boundary therebetween in an atmospheric air, each cassette stand having means for moving the associated cassette stand between first and second positions vertically spaced from one another;
means for exchanging one cassette installed on one of said two cassette stands with a new cassette when said one of said two cassette stands is in said first position and the other of said two cassette stands on which another cassette is installed is in said second position;
a vacuum processing chamber for processing said wafers in a vacuum condition therein; and
wafer transfer means located between said cassette stands and said vacuum processing chamber for transferring said wafers between each of said cassettes installed on said cassette stands in said first position and said vacuum processing chamber.

* * * * *